United States Patent [19]
Nguyen et al.

[11] Patent Number: 6,080,676
[45] Date of Patent: Jun. 27, 2000

[54] DEVICE AND METHOD FOR ETCHING SPACERS FORMED UPON AN INTEGRATED CIRCUIT GATE CONDUCTOR

[75] Inventors: Thien T. Nguyen, Austin; Mark I. Gardner, Cedar Creek; Charles E. May, Austin, all of Tex.

[73] Assignee: Advanced Micro Devices, Inc., Sunnyvale, Calif.

[21] Appl. No.: 09/154,843

[22] Filed: Sep. 17, 1998

[51] Int. Cl.$^7$ .................................................. H01L 21/302
[52] U.S. Cl. .................... 438/706; 438/710; 438/711; 438/714; 438/723; 438/729
[58] Field of Search .................... 438/700, 706, 438/624, 707, 710, 711, 714, 723, 729; 216/13; 156/345

[56] References Cited

U.S. PATENT DOCUMENTS

| | | | |
|---|---|---|---|
| 4,326,911 | 4/1982 | Howard et al. | 438/718 |
| 4,348,577 | 9/1982 | Toyada et al. | 219/121.41 |
| 4,952,274 | 8/1990 | Abraham | 438/697 |
| 4,978,420 | 12/1990 | Bach | 438/624 |
| 5,021,121 | 6/1991 | Groechel et al. | 438/712 |
| 5,169,487 | 12/1992 | Langley et al. | 438/714 |
| 5,171,401 | 12/1992 | Roselle | 438/720 |
| 5,219,793 | 6/1993 | Cooper et al. | 438/624 |
| 5,242,538 | 9/1993 | Hamrah et al. | 216/66 |
| 5,254,494 | 10/1993 | Van Der Plas et al. | 438/448 |
| 5,316,980 | 5/1994 | Takeshiro | 438/697 |
| 5,317,193 | 5/1994 | Watanabe | 257/774 |
| 5,322,590 | 6/1994 | Koshimizu | 438/9 |
| 5,374,332 | 12/1994 | Koyama et al. | 216/13 |
| 5,398,712 | 3/1995 | Wang et al. | 137/15 |
| 5,399,527 | 3/1995 | Tabara | 438/625 |
| 5,401,998 | 3/1995 | Chiu et al. | 257/368 |
| 5,445,709 | 8/1995 | Kojima et al. | 438/697 |
| 5,461,010 | 10/1995 | Chen et al. | 438/699 |
| 5,472,829 | 12/1995 | Ogawa | 430/325 |
| 5,529,948 | 6/1996 | Lur et al. | 438/450 |
| 5,534,731 | 7/1996 | Cheung | 257/759 |
| 5,549,784 | 8/1996 | Carmody et al. | 438/700 |
| 5,549,786 | 8/1996 | Jones et al. | 438/723 |
| 5,571,751 | 11/1996 | Chung | 438/625 |
| 5,632,855 | 5/1997 | Jones et al. | 438/7.4 |

FOREIGN PATENT DOCUMENTS

| | | |
|---|---|---|
| 0 596 593 | 5/1994 | European Pat. Off. . |
| 0 655 775 | 5/1995 | European Pat. Off. . |
| 2240923 | 9/1990 | Japan . |
| 5129247 | 5/1993 | Japan . |

OTHER PUBLICATIONS

Tsai et al., "High selectivity plasma etching of silicon dioxide with a dual frequency 27/2 MHz capacitive radio frequency discharge," J. Vac. Sci. Technol. B, vol. 14, No. 5, Sep./Oct. 1996, pp. 3276–3282.

International Search Report for Application No. PCT/US99/05479 mailed Jun. 15, 1999.

Wolf, "Silicon Processing for the VLSI Era Process Integration," p. 198.

*Primary Examiner*—Benjamin L. Utech
*Assistant Examiner*—Binh X Tran
*Attorney, Agent, or Firm*—Kevin L. Daffer; Conley, Rose & Tayon

[57] ABSTRACT

A dry etch process is presented wherein a semiconductor substrate is introduced into a reaction chamber between a first electrode and a second electrode. The semiconductor substrate may be positioned on the first electrode. A main flow of gas that includes an argon flow at an argon flow rate and a fluorocarbon flow at a fluorocarbon flow rate is established into the reaction chamber. RF power at a low frequency may then be applied to the first electrode for creating a fluorine-deficient plasma. An oxide layer arranged above the semiconductor substrate is exposed to the fluorine-deficient plasma for etching, in a single step, a portion of the oxide layer.

19 Claims, 4 Drawing Sheets

DEVICE AND METHOD FOR ETCHING SPACERS FORMED UPON AN INTEGRATED CIRCUIT GATE CONDUCTOR

BACKGROUND OF THE INVENTION

1. Field of the Invention

This invention relates to semiconductor processing and, more particularly, to an improved dry etch method of use in the formation of ultra thin spacers.

2. Description of the Related Art

Fabrication of a metal oxide semiconductor field-effect transistor (MOSFET) device is well known. MOSFETs are generally manufactured by placing an undoped polycrystalline silicon ("polysilicon") material over a relatively thin layer of silicon dioxide ("oxide"). The polysilicon material and the oxide are then patterned to form a gate conductor arranged upon a gate oxide with source/drain regions adjacent to and on opposite sides of the gate conductor. The gate conductor and source/drain regions are then implanted with an impurity dopant species.

Operating transistors which have heavily doped source/drain regions arranged directly adjacent to the gate conductor often experience a problem known as hot carrier injection ("HCI"). HCI is a phenomena by which the kinetic energy of the charged carriers (holes or electrons) is increased as they are accelerated through large potential gradients, causing the charged carriers to become injected into and trapped within the gate oxide. The greatest potential gradient, often referred to as the maximum electric field ("Em") occurs near the drain during saturated operation. Because of carrier entrapment within the gate oxide, a net negative charge density forms in the gate oxide. The trapped charge can accumulate with time, resulting in a positive threshold shift in a NMOS transistor, or a negative threshold shift in a PMOS transistor.

To overcome problems of sub-threshold current and threshold shift resulting from HCI, an alternative drain structure known as the lightly doped drain ("LDD") is commonly used. The purpose of the LDD is to absorb some of the potential into the drain and thus reduce Em. A conventional LDD structure is one in which a light concentration of dopant is self-aligned to the gate conductor followed by a heavier dopant self-aligned to the gate conductor on which two sidewall spacers have been formed. The purpose of the first implant dose is to produce a lightly doped section within the active area (hereinafter "junction") at the gate edge near the channel. The second implant dose is used to form a heavily doped source/drain region within the junction laterally outside the LDD area. Because the second implant dose is spaced from the channel by the spacers, the lateral thickness of the spacers dictates the thickness of the LDD and source/drain regions.

The spacers are typically formed by first chemical vapor depositing ("CVD") an oxide layer over the gate conductor. The oxide layer is then patterned to form spacers on the sidewalls of the gate conductor. Since the oxide layer is conformally deposited over the gate conductor, and thus is thicker at the edges of the gate-to-junction step then on flat (horizontal) areas, an anisotropic etch process will clear oxide from the flat areas while leaving spacers on the side walls of the gate electrode. Because of the ability of dry etch processes to etch anisotropically (in comparison to wet etch processes, which etch isotropically), dry etching is typically used in spacer formation.

There are three types of dry etching processes: those that have a physical basis (e.g., ion beam milling), those that have a chemical basis (e.g., plasma etching), and those that combine both physical and chemical mechanisms (e.g., reactive ion etching). Primarily physical dry etch methods may not exhibit sufficient selectivity to both masking materials and the underlying substrate, while primarily chemical processes typically etch isotropically. Consequently, ion-assisted etching processes that combine the two mechanisms are often preferred in spacer fabrication.

Ion assisted etching can be carried out in a variety of types of commercial dry etch systems. One commonly used configuration is the parallel electrode reactor system. These systems typically have a diode configuration with two parallel, circular electrodes spaced by a gap. One of the electrodes is connected to a radio frequency (RF) power supply, and the other is grounded. The wafer is placed on the to-be-powered electrode. A pump is used to adjust the pressure within the reaction chamber to the desired level, and extant gases are introduced into the reaction chamber. By applying power to an electrode, a plasma may be created within the chamber. Because the wafer is placed on the powered electrode, energized ions from the plasma may bombard the wafer. The combination of physical and chemical processes allows for etching that is both anisotropic and selective. The degree of anisotropy and selectivity, as well as other factors such as the etch rate, are determined by a variety of parameters. These parameters include: the quantity and frequency of the power supplied, the gap between the electrodes, the type and flow rate of extant gas into the reaction chamber, and the pressure within the reaction chamber.

The values of the above-listed parameters selected for a particular etching process can have a significant impact on the properties of the final integrated circuit. Therefore, these values must be carefully selected. Because of the effect that the width of the LDD and source/drain regions has on circuit attributes (e.g., drive current), it is important that the thickness of these regions be as close to the desired values as possible. Consequently, the dry etch processes used in the fabrication of sidewall spacers should result in the formation of spacers that have a high degree of thickness uniformity. That is, the thickness of sidewall spacers should vary as little as possible from desired values. Spacer thickness uniformity should occur both across each wafer and from wafer-to-wafer.

One measure of spacer thickness uniformity is the standard deviation of the thicknesses of a number of spacers. Standard deviation is a measure of the dispersion of a set of data from their mean, and may be calculated by taking the square root of the variance. By looking at the standard deviation of the thicknesses of a set of spacers formed by a particular etch process, the ability of that process to form uniformly thick spacers may be seen. Unfortunately, most conventional etch processes are only capable of forming spacers whose thicknesses have a standard deviation of 25 angstroms or greater. These variations in thickness can translate into deviations in LDD and source/drain width that deleteriously effect circuit performance. In addition, as feature size decreases the thickness of the spacers should also decrease as well. Because reduced feature sizes exacerbate the effect of a specific amount of deviation from average, the variability in spacer thickness uniformity that may result from conventional dry etch processes becomes an even greater problem when ultra thin spacers must be formed. Therefore, it is desirable to develop a method that would allow the formation of spacers with a higher degree of thickness uniformity than is possible with current etch techniques.

SUMMARY OF THE INVENTION

The problems described above are in large part addressed by the improved dry etch device and method presented herein. The process preferably uses ion-assisted etching and is able to etch oxide deposited by a variety of techniques and containing various amounts of impurities. The process parameters chosen preferably allow for an etch process that has a high selectivity to silicon. The oxide:silicon selectivity ratio is preferably about 15:1, which may minimize damage to any silicon underlying the oxide that is etched. The selected process parameters may also provide for an etch rate of about 15 angstroms/second, which is slower than many conventional processes. The relatively low etch rate and high selectivity to silicon, however, preferably allow for an overetch yield of about 10%. This overetch yield is higher than that used in many processes, and may help to ensure a more thorough clear out of oxide that is, e.g., overlying junctions.

The selected process parameters preferably provide for an etch process that has a high degree of anisotropy. As a result of these benefits, the present process is preferably able to produce improved spacer uniformity both within a wafer (less than about 2 angstroms/standard deviation) and from wafer-to-wafer (less than about 3 angstroms/standard deviation). Even when forming spacers as thin as about 50 angstroms, a high degree of thickness uniformity may be maintained. Because of the increased spacer thickness uniformity, the present process preferably aids in the formation of LDD and source/drain regions that have widths very close to desired values. Consequently, semiconductor devices may be fabricated which have properties that are more consistent. Although the process is of particular use in spacer fabrication, it should be understood that the process may be applicable in a variety of oxide etch situations in which an etch process that has these attributes would be beneficial.

Broadly speaking, the present invention presents a dry etch method. A semiconductor substrate is introduced into a reaction chamber, which preferably includes a first electrode and a second electrode. The semiconductor substrate may be positioned on the first electrode. A main flow of gas that includes an argon flow at an argon flow rate and a fluorocarbon flow at a fluorocarbon flow rate is preferably established into the reaction chamber. RF power at a low frequency may then be applied to the first electrode for creating a fluorine-deficient plasma. An oxide layer arranged above the semiconductor substrate is preferably exposed to the fluorine-deficient plasma for etching, in a single step, a portion of the oxide layer. This single step etch preferably allows for higher throughput and better manufacturablilty than many conventional processes that attempt to achieve similar uniformity goals by using multiple etch steps.

In one embodiment, the oxide layer is disposed upon a gate electrode arranged above the semiconductor substrate. Etching of the oxide layer preferably forms spacers from the oxide layer that are arranged on the sidewalls of the gate electrode.

According to another embodiment, a semiconductor substrate is introduced into a reaction chamber, which preferably includes a first electrode and a second electrode. The first electrode and second electrode are preferably parallel and spaced by a gap of about 1.0–1.2 cm. The semiconductor substrate may be positioned on the first electrode. The pressure within the reaction chamber is preferably set at about 180–220 mT, and a main flow of gas into the reaction chamber is preferably established. The main flow of gas preferably includes an argon flow at an Ar flow rate of about 350–450 sccm, a $CHF_3$ flow at a $CHF_3$ flow rate of about 31.5–38.5 sccm, and a $CF_4$ flow at a $CF_4$ flow rate of about 13.5–16.5 sccm. About 180–220 watts of RF power at a frequency of about 360–440 kHz may then be applied to the first electrode for creating a plasma. An oxide layer arranged above the semiconductor substrate is preferably exposed to the plasma for etching, in a single step, a portion of the oxide layer.

According to another embodiment, a semiconductor substrate is introduced into a reaction chamber, which preferably includes a first electrode and a second electrode. A first plurality of gate electrodes may be arranged above the semiconductor substrate. The semiconductor substrate is preferably positioned on the first electrode. A main flow of gas that includes an argon flow at an argon flow rate and a fluorocarbon flow at a fluorocarbon flow rate is preferably established into the reaction chamber. RF power at a low frequency is preferably applied to the first electrode for creating a fluorine-deficient plasma. A first plurality of spacers may then be formed on the sidewalls of the plurality of gate electrodes. The first plurality of spacers is formed in a single step etching process in which oxide disposed on the plurality of gate structures is exposed to the fluorine-deficient plasma. After etching is completed, the standard deviation of the thicknesses of the first plurality of spacers is preferably less than about 2.0 angstroms. The average thickness of the first plurality of spacers may be less than about 200 angstroms and as thin as about 50 angstroms while maintaining a high degree of thickness uniformity.

The above process may be used to etch oxide on a plurality of semiconductor substrates. For example, a second plurality of gate electrodes may be arranged on a plurality of semiconductor substrates. By repeating the above process over the plurality of semiconductor substrates, a second plurality of spacers may be formed on the sidewalls of the second plurality of gate structures. After etching is completed, the standard deviation of the thicknesses of the second plurality of spacers is preferably less than about 3.0 angstroms.

According to another embodiment, a plurality of gate electrodes is arranged above a semiconductor substrate. A plurality of spacers is preferably arranged on the sidewalls of the plurality of gate electrodes. The standard deviation of the thicknesses of the plurality of spacers is preferably less than about 2.0 angstroms. The average thickness of the plurality of spacers may be less than about 200 angstroms and as thin as about 50 angstroms while maintaining a high degree of thickness uniformity.

BRIEF DESCRIPTION OF THE DRAWINGS

Other objects and advantages of the invention will become apparent upon reading the following detailed description and upon reference to the accompanying drawings in which.

Figure 1:
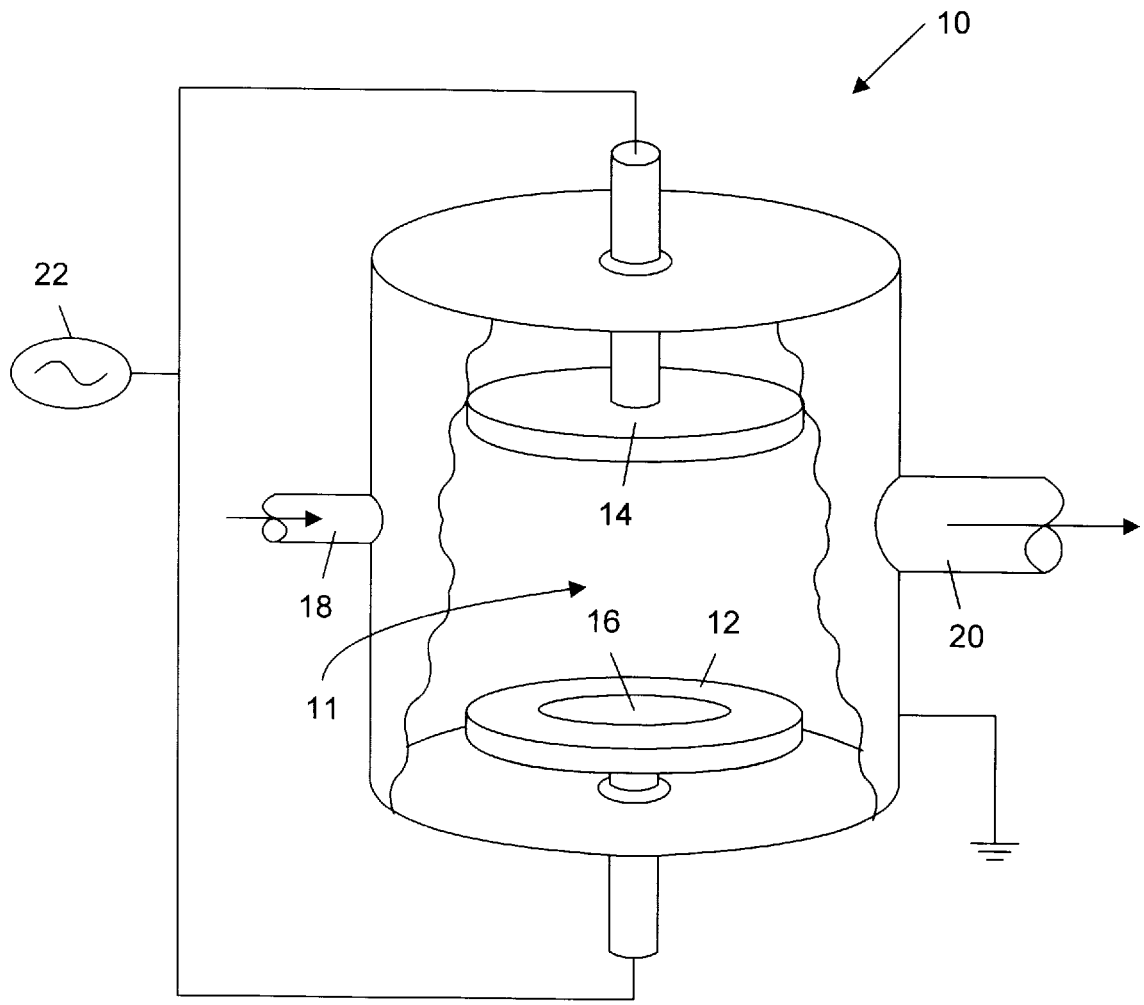
FIG. 1 is an isometric view in partial breakaway of a parallel electrode reactor configured to be used in ion-assisted etching processes.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Referring now to FIG. 1, a parallel electrode reactor system 10 is shown that configured to be used in ion-assisted etching processes. Reactor system 10 may be any of the variety of commercially available reactors that are capable of carrying out the present invention. A suitable system is the Lam model 4528, which may be obtained from Lam Research Corporation, Freemont, Calif. Reactor 10 includes a first electrode 12 and a second electrode 14 within a reaction chamber 11. First electrode 12 is preferably connected to RF power source 22, and second electrode 14 is preferably grounded. In dry etch reactors, high frequency RF power sources are commonly used that supply power at 13.56 MHz. This is an ISM (Industry, Scientific, Medical) standard frequency, and thus is subject to less stringent government mandated radiation limits. Power source 22, however, is preferably a low frequency (i.e., <5 MHz) RF source. Because ion bombardment effects are enhanced at lower frequencies, the use of low frequency power preferably provides for a higher degree of anisotropy in etching. The frequency of power supplied by power source 22 is more preferably about 360–440 kHz, and optimally about 400 kHz.

Figure 2:
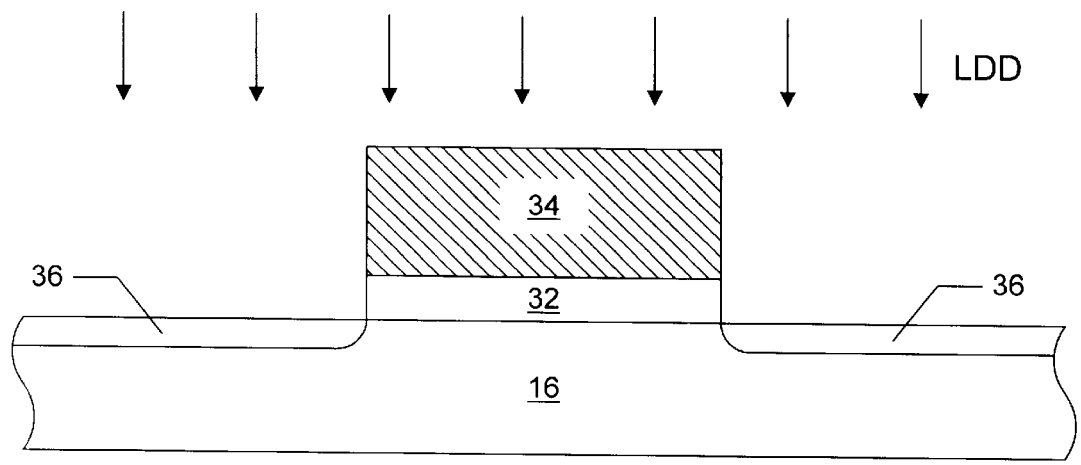
FIG. 2 is a partial cross-sectional view of a semiconductor topography, wherein a LDD implant that is self-aligned to the sidewalls of a gate conductor is forwarded to the semiconductor topography.
Figure 3:
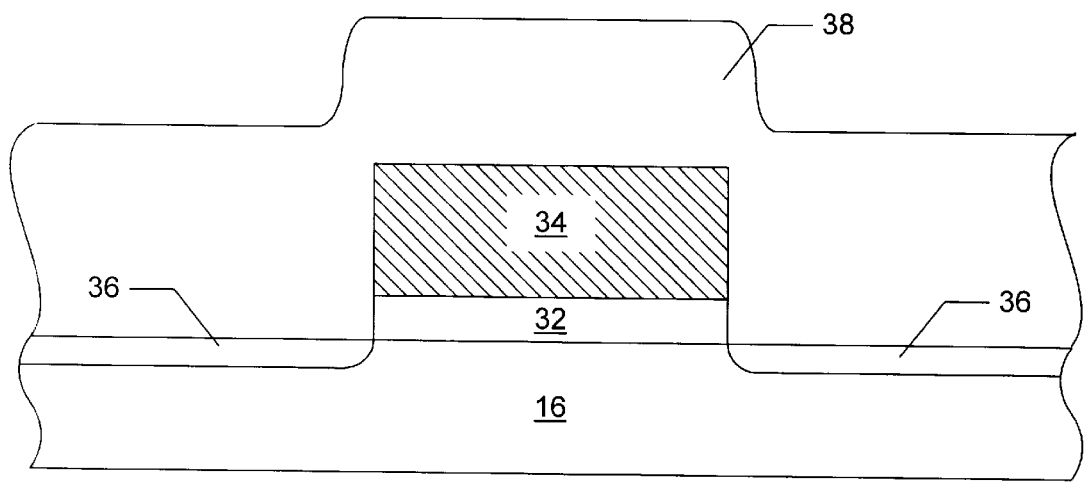
FIG. 3 is a partial cross-sectional view of a semiconductor topography, wherein a conformal oxide layer is deposited over the gate conductor according to a processing step subsequent to FIG. 2.

FIGS. 2, 3, 4, and 5 present a typical process flow in which sidewall spacers may be used to help define LDD and source/drain regions within a semiconductor substrate. Reactor system 10 may be utilized in the fabrication of the spacers. FIG. 2 depicts a semiconductor substrate 16, which is preferably a wafer of single crystal silicon. Gate conductor 34 and gate oxide 32 are preferably arranged upon the surface of semiconductor substrate 16. An LDD implant may be carried out to form LDD regions 36 that are aligned to the sidewalls of gate conductor 34. As shown in FIG. 3., an oxide layer 38 may then be conformally deposited from, for example, a TEOS or silane source over gate conductor 34.

Referring back to FIG. 1, semiconductor substrate 16 may then be positioned adjacent to (preferably directly onto) first electrode. The gap between the electrodes is may be set at about 1.0–1.2 cm, and optimally at about 1.1 cm. A pump may be attached to port 20 to control the pressure within and remove gases from reaction chamber 11. A main flow of gas is established through port 18 into reaction chamber 11. The main flow of gas includes an argon flow at an argon flow rate and a fluorocarbon flow at a fluorocarbon flow rate. Fluorocarbons, such as $CF_4$, are typically used to etch oxide.

The ratio of F atoms to C atoms in the fluorocarbon flow, and thus in the to-be-formed plasma, is an important indicator of the selectivity to silicon over oxide of the plasma. For example, a plasma formed from pure $CF_4$ has a F:C ratio of 4. The oxide:silicon selectivity decreases with F:C ratios greater than 4 and increases with F:C ratios less than 4. Plasmas in which the F:C ratio is less than 4 are termed fluorine-deficient plasmas. By using gases with F:C ratios less than 4, such as $CHF_3$, a fluorine-deficient plasma may be formed and a higher oxide:silicon selectivity ratio may be obtained. The F:C ratio within the fluorocarbon flow is preferably about 3.26–3.34:1, and optimally about 3.30:1.

The fluorocarbon flow is preferably composed of $CHF_3$ and $CF_4$. The ratio of the $CHF_3$ flow rate to the $CF_4$ flow rate is about 1.91–2.85: 1, and optimally about 2.33:1. The $CHF_3$ flow rate is about 31.5–38.5 sccm, and is optimally about 35 sccm. The $CF_4$ flow rate is about 13.5–16.5 sccm, and is optimally about 15 sccm. The argon flow rate is about 350–450 sccm, and is optimally about 400 sccm. The pressure within the reaction chamber is set at about 180–220 mT, and optimally at about 200 mT. The pressure and flow rate of gas into the chamber are maintained at the chosen levels for a time sufficient for stabilization of the gas flow rates and reaction chamber pressure before formation of a plasma within the chamber. An additional stabilization step may be undertaken in which wafer 16 is secured to first electrode 12 to ensure electrical connectivity therebetween.

Once the environment within the reaction chamber is sufficiently stabilized, power source 22 can supply about 180–220 watts, and optimally about 200 watts, of power to first electrode 12. The potential difference between the powered first electrode and the grounded second electrode serves to create a fluorine-deficient plasma within the reaction chamber. Ion bombardment of wafer 16, in conjunction with the diffusion of reactive specie within the plasma to the topography of wafer 16, allows oxide layer 38 to be etched in a highly directional manner. Etching of oxide layer 38 occurs at a rate of 10–15 angstroms per second. The total time needed to etch oxide layer 38 is dependent on the thickness of oxide layer 38.

Figure 4:
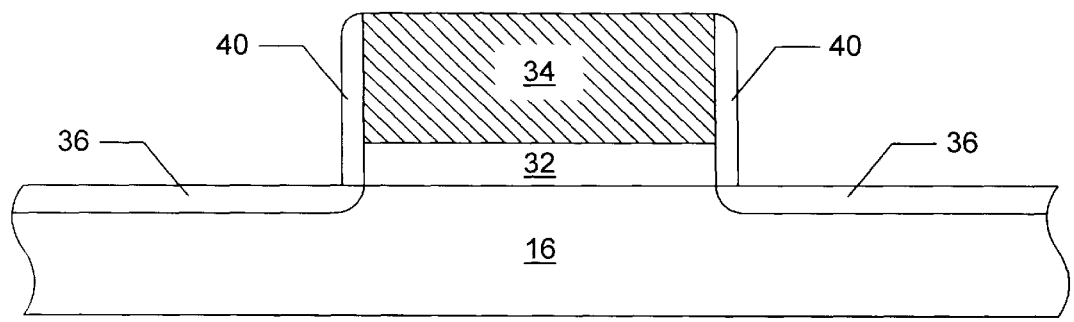
FIG. 4 is a partial cross-sectional view of the semiconductor topography, wherein oxide spacers are formed on the sidewalls o f the gate conductor according to a processing step subsequent to FIG. 3.

As shown in FIG. 4, etching of oxide layer 38 is continued until spacers 40 are formed on the sidewalls of gate electrode 34. Various endpoint detection mechanisms (e.g., optical emission spectroscopy and mass spectroscopy) may be used to determine when portions of the substrate are being etched by the plasma and etching should be discontinued. Depending upon the nature of byproducts and particulate matter arising from the formation of spacers 40, multiple stabilization and flush steps may be necessary after etching is completed. Regardless of the number and type of these steps required, etching of oxide layer 38 to form spacers 40 preferably occurs in a single step.

During spacer formation, it is necessary that the etch process used to form the spacers clear out a sufficient amount of the oxide overlying LDD regions 36. To help assure sufficient oxide clear out, a small portion of the total etch time is typically allotted for overetch. The overetch yield is the percentage of the overall etch period allotted for overetch. A typical high etch rate process (e.g., >25 Angstroms/second) may have a 5% overetch yield. In these processes, the low overetch yield may greatly reduce the amount of time available for clear out. In many circumstances, the time available for clear out in these processes can be less than a second, which may make the degree of overetch hard to control. In contrast, the relatively low etch rate and high selectivity to silicon of the process disclosed herein preferably allows for an overetch yield of about 10%. Consequently, the present process may provide for improved control of oxide clear out by allowing a longer time for overetch.

Figure 5:
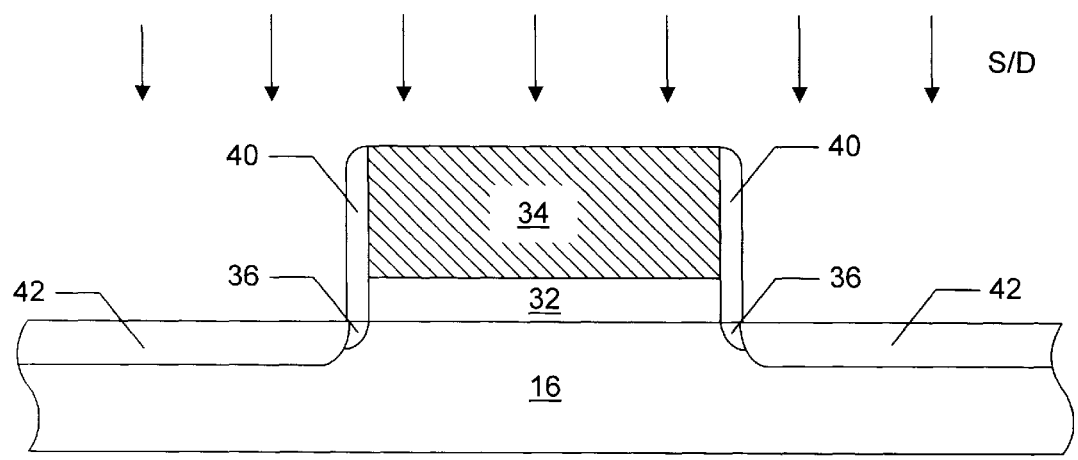
FIG. 5 is a partial cross-sectional view of the semiconductor topography, wherein a source/drain implant that is self-aligned to the exposed lateral surfaces of the oxide spacers is forwarded to the semiconductor topography according to a processing step subsequent to FIG. 4.
Figure 6:
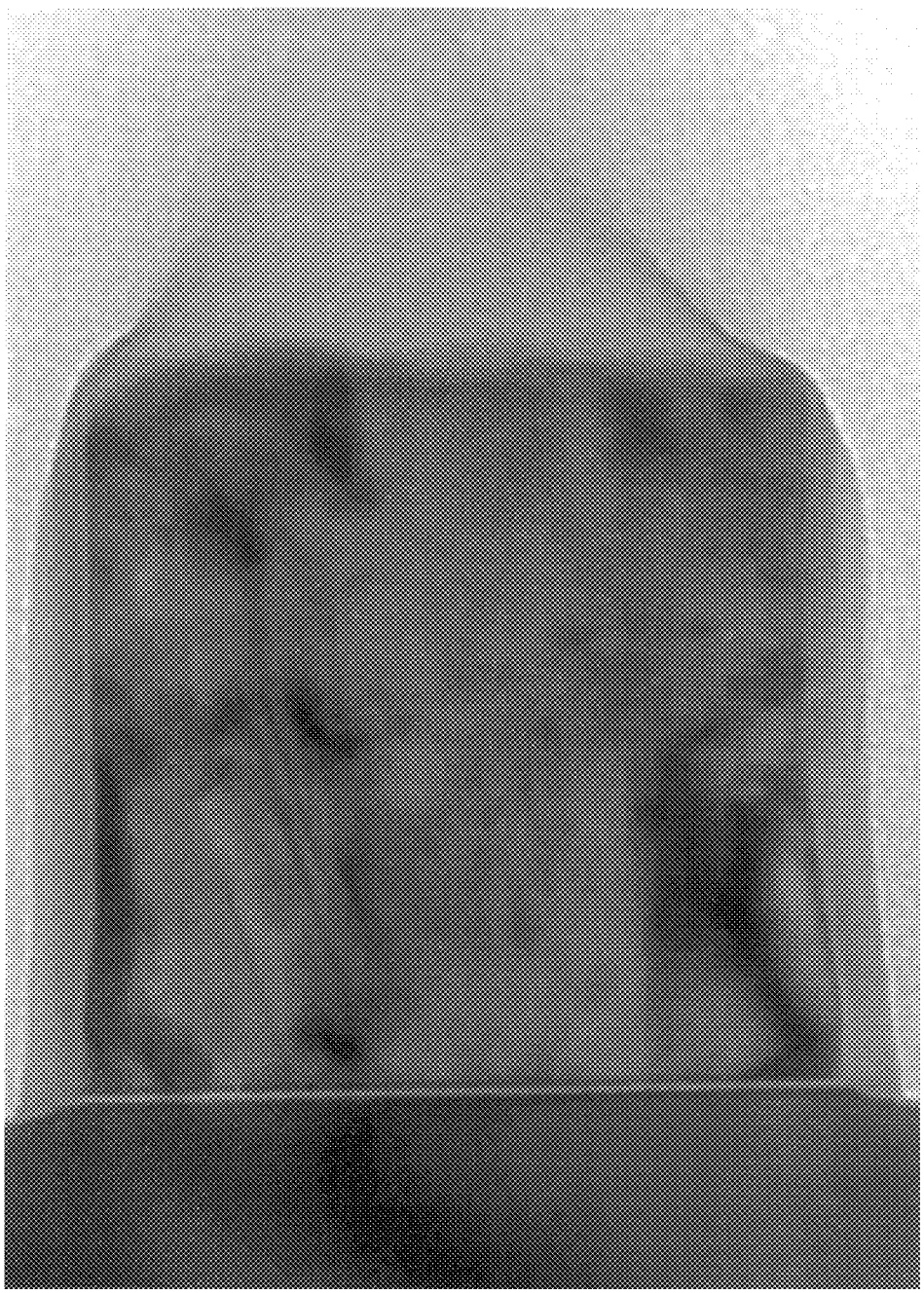
FIG. 6 is a SEM photo of a MOS transistor produced by an embodiment of the present method.

FIG. 5 shows a subsequent source/drain implant that may be used to form source/drain regions 42. Since spacers 40 prevent implantation of the portions of semiconductor substrate 40 directly beneath them, the widths of LDD regions 36 and source/drain regions 42 are thus defined by the thicknesses of spacers 40 (with some allowance for diffusion of dopants from source/drain regions 42 under spacers 40). FIG. 6 is a SEM photograph of a MOS transistor produced by an embodiment of the present method. As may be seen in this figure, the present process is able to form sidewall spacers with a high degree of anisotropy.

It will be appreciated to those skilled in the art having the benefit of this disclosure that this invention is believed to provide a dry etch method for etching oxide. It is understood that while this process is of particular benefit in the fabrication of ultra thin spacers, the process may be used to form spacers of a variety of thicknesses with a high degree of uniformity. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A dry etch method, comprising:
    introducing a semiconductor substrate between a pair of electrodes maintained within a reaction chamber flooded with an argon gas flow and a fluorocarbon gas flow, wherein the fluorocarbon flow comprises fluorine and carbon at a ratio of about 3.26–3.34:1; and
    applying RF power in the frequency range of 360 to 440 kHz to at least a first electrode of the pair of electrodes for etching an oxide layer arranged upon the semiconductor substrate, wherein said etching occurs at a rate of about 10–15 angstroms per second.

2. The method of claim 1, wherein the oxide layer is disposed upon a gate electrode arranged above the semiconductor substrate, and wherein said etching forms spacers from the oxide layer and removes a portion of the oxide layer directly above said gate electrode, and wherein the spacers are arranged on the sidewalls of the gate electrode.

3. The method of claim 1, wherein the fluorocarbon gas flow comprises a $CHF_3$ flow rate and a $CF_4$ flow rate, wherein the ratio between the $CHF_3$ flow rate and the $CF_4$ flow rate is about 1.91–2.85:1.

4. The method of claim 1, wherein said etching removes oxide compared to silicon at a rate of about 15:1.

5. The method of claim 1, wherein the second electrode is grounded.

6. The method of claim 3, wherein the fluorocarbon gas flow comprises a $CHF_3$ flow rate of about 31.5–38.5 sccm and a $CF_4$ flow rate of about 13.5–16.5 sccm.

7. The method of claim 3, wherein a gap between the first electrode and the second electrode is about 1.0–1.2 cm.

8. The semiconductor substrate of claim 3, wherein a plurality of gate electrodes is arranged above the semiconductor substrate, and wherein said etching further comprises etching oxide disposed above the semiconductor substrate to form a plurality of spacers arranged on the sidewalls of the plurality of gate electrodes, and wherein the plurality of spacers comprise a standard deviation from said average thickness of less than approximately 2.0 angstroms.

9. The semiconductor substrate of claim 3, further comprising:
    maintaining said applying RF power for a main etch time, wherein the main etch time is the time from when said applying begins until a time sufficient to expose a portion of the semiconductor substrate region initially beneath the oxide layer given the etch rate and the oxide layer thickness; and
    overetching the oxide layer by continuing to apply RF power to at least the first electrode for an overetch time, wherein the overetch time is about 10% of the main-etch time.

10. The method of claim 6, wherein the argon gas flow is about 350–450 sccm.

11. The method of claim 10, further comprising setting the pressure within the reaction chamber at about 180–220 mT.

12. The semiconductor substrate of claim 8, wherein an average thickness of said plurality of spacers is between 50 to 200 angstroms.

13. The semiconductor substrate of claim 8, wherein the argon gas flow comprises an argon gas flow rate greater than 10 times the $CHF_3$ flow rate, and wherein a gap between the first electrode and the second electrode is greater than 1.0, and wherein the oxide comprises deposited oxide.

14. A dry etch method, comprising:
    introducing a semiconductor substrate into a reaction chamber, wherein the reaction chamber comprises a first electrode and a second electrode, wherein the first electrode and second electrode are parallel and spaced by a gap of about 1.0–1.2 cm;
    positioning the semiconductor substrate adjacent to the first electrode;
    setting the pressure within the reaction chamber at about 180–220 mT;
    establishing a main flow of gas into the reaction chamber, wherein the main flow comprises an Ar flow at an Ar flow rate of about 350–450 sccm, a $CHF_3$ flow at a $CEF_3$ flow rate of about 31.5–38.5 sccm, and a $CF_4$ flow at a $CF_4$ flow rate of about 13.5–16.5 sccm;
    applying about 180–220 watts of power from an RF power source to at least the first electrode for creating a fluorine-deficient plasma, wherein the power supplied by the RF power source has a frequency of about 360–440 kHz; and
    etching, in a single step, an oxide layer arranged above the semiconductor substrate by exposing the oxide layer to the fluorine-deficient plasma, wherein said etching occurs at a rate of about 10–15 angstroms per second.

15. The method of claim 14, wherein the oxide layer is disposed upon a gate electrode arranged above the semiconductor substrate, and wherein said etching forms spacers from the oxide layer and removes a portion of the oxide layer directly above said gate electrode, and wherein the spacers are arranged on the sidewalls of the gate electrode.

16. The method of claim 14, wherein the gap is about 1.1 cm.

17. The semiconductor substrate of claim 14, wherein a plurality of gate electrodes is arranged above the semiconductor substrate, and wherein said etching further comprises etching oxide disposed above the semiconductor substrate to form a plurality of spacers arranged on the sidewalls of the plurality of gate electrodes, and wherein the plurality of spacers comprise a standard deviation from said average thickness of less than approximately 2.0 angstroms.

18. The method of claim 15, wherein the Ar flow rate is about 400 sccm, and wherein the $CHF_3$ flow rate is about 35 sccm, and wherein the $CF_4$ flow rate is about 15 sccm, and wherein the pressure in said setting the pressure within the reaction chamber is about 200 mT.

19. The method of claim 18, wherein the power supplied by the RF power source in said applying is about 200 W, and wherein the frequency of the power supplied by the RF power source in said applying is about 400 kHz.

* * * * *

UNITED STATES PATENT AND TRADEMARK OFFICE
CERTIFICATE OF CORRECTION

PATENT NO. : 6,080,676
DATED : June 27, 2000
INVENTOR(S) : Nguyen et al.

It is certified that error appears in the above-identified patent and that said Letters Patent is hereby corrected as shown below:

Column 7, claim 8,
Lines 54-61, please delete "The semiconductor substrate of claim 3, wherein a plurality of gate electrodes is arranged above the semiconductor substrate, and wherein said etching further comprises etching oxide disposed above the semiconductor substrate to form a plurality of spacers arranged on the sidewalls of the plurality of gate electrodes, and wherein the plurality of spacers comprise a standard deviation from said average thickness of less than approximately 2.0 angstroms"

and substitute therefor -- The method of claim 3, wherein said etching further comprises etching oxide disposed above the semiconductor substrate to form a plurality of spacers arranged on the sidewalls of a plurality of gate electrodes arranged above the semiconductor substrate, and wherein the plurality of spacers comprise a standard deviation from said average thickness of less than approximately 2.0 angstroms. --

Column 7, claim 9,
Line 62, please delete the phrase "semiconductor substrate" and substitute therefor -- method --.

Column 8, claim 12,
Line 11, please delete the phrase "semiconductor substrate" and substitute therefor -- method --.

Column 8, claim 13,
Line 14, please delete the phrase "semiconductor substrate" and substitute therefor -- method --.

UNITED STATES PATENT AND TRADEMARK OFFICE
CERTIFICATE OF CORRECTION

PATENT NO. : 6,080,676
DATED : June 27, 2000
INVENTOR(S) : Nguyen et al.

It is certified that error appears in the above-identified patent and that said Letters Patent is hereby corrected as shown below:

Column 8, claim 17,
Lines 50-61, please delete "The semiconductor substrate of claim 14, wherein a plurality of gate electrodes is arranged above the semiconductor substrate, and wherein said etching further comprises etching oxide disposed above the semiconductor substrate to form a plurality of spacers arranged on the sidewalls of the plurality of gate electrodes, and wherein the plurality of spacers comprise a standard deviation from said average thickness of less than approximately 2.0 angstroms"

and substitute therefor -- The method of claim 14, wherein said etching further comprises etching oxide disposed above the semiconductor substrate to form a plurality of spacers arranged on the sidewalls of a plurality of gate electrodes arranged above the semiconductor substrate, and wherein the plurality of spacers comprise a standard deviation from said average thickness of less than approximately 2.0 angstroms. --

Signed and Sealed this

First Day of January, 2002

Attest:

Attesting Officer

JAMES E. ROGAN
Director of the United States Patent and Trademark Office